US007834388B2

(12) United States Patent
Yu et al.

(10) Patent No.: US 7,834,388 B2
(45) Date of Patent: Nov. 16, 2010

(54) MEMORY ARRAY OF NON-VOLATILE ELECTRICALLY ALTERABLE MEMORY CELLS FOR STORING MULTIPLE DATA

(75) Inventors: Andy Yu, Palo Alto, CA (US); Ying W. Go, Palo Alto, CA (US)

(73) Assignee: Nanostar Corporation, Palo Alto, CA (US)

( * ) Notice: Subject to any disclaimer, the term of this patent is extended or adjusted under 35 U.S.C. 154(b) by 0 days.

(21) Appl. No.: 11/348,556

(22) Filed: Feb. 6, 2006

(65) Prior Publication Data

US 2006/0131640 A1    Jun. 22, 2006

Related U.S. Application Data

(62) Division of application No. 10/801,789, filed on Mar. 16, 2004.

(51) Int. Cl.
*H01L 29/788* (2006.01)
*H01L 21/8238* (2006.01)
(52) U.S. Cl. ............... 257/316; 257/208; 257/E27.103; 257/E29.304; 257/E29.308; 365/185.06; 365/185.12

(58) Field of Classification Search ......... 257/314–316, 257/208, E27.103, E29.304, E29.308; 365/185.11, 365/185.18, 230.03, 185.06, 185.12
See application file for complete search history.

(56) References Cited

U.S. PATENT DOCUMENTS

| 4,959,812 | A | * | 9/1990 | Momodomi et al. | ... | 365/185.17 |
| 5,075,890 | A | * | 12/1991 | Itoh et al. | ............. | 365/185.17 |
| 5,159,570 | A | * | 10/1992 | Mitchell et al. | ........ | 365/185.03 |
| 5,517,448 | A | * | 5/1996 | Liu | ........................ | 365/185.11 |
| 6,265,739 | B1 | * | 7/2001 | Yaegashi et al. | ............ | 257/296 |
| 6,570,810 | B2 | * | 5/2003 | Wong | .................... | 365/230.03 |
| 6,914,820 | B1 | * | 7/2005 | Wong | .................... | 365/185.18 |
| 7,177,188 | B2 | * | 2/2007 | Iwata et al. | ............ | 365/185.05 |

* cited by examiner

*Primary Examiner*—Anh D Mai
(74) *Attorney, Agent, or Firm*—Haynes and Boone, LLP

(57) ABSTRACT

A memory cell that includes a control gate disposed laterally between two floating gates where each floating gate is capable of holding data. Each floating gate in a memory cell may be erased and programmed by applying a combination of voltages to diffusion regions, the control gate, and a well. A plurality of memory cells creates a memory string, and a memory array is formed from a plurality of memory strings arranged in rows and columns.

19 Claims, 12 Drawing Sheets

P-Type Diffusion

| Erase | | |
|---|---|---|
| | select | unselect |
| 106a node | x or Vpp | Vpp |
| 106b node | Vpp | Vpp |
| CG | Vnn | Vpp |
| SG0 | Vpp or 0v | Vpp |
| SG1 | 0v | Vpp |
| well | Vpp | Vpp or Vcc |

| Soft avalanche hot electron (SAHE) program | | |
|---|---|---|
| | select | unselect |
| 106a node | x | vcc or x |
| 106b node | Vnn | Vcc or x |
| CG | Vpp | Vnn |
| SG0 | Vcc | Vcc |
| SG1 | Vnn | Vcc |
| well | 0v to Vcc | 0v to Vcc |

| Channel hot electron (CHE) program | | |
|---|---|---|
| | select(right bit) | unselect |
| 106a node | Vpp | Vpp |
| 106b node | 0v | Vpp |
| CG | Vppr | 0v to -2v* |
| SG0 | 0v | Vpp |
| SG1 | 0v | Vpp |
| well | Vpp | Vpp |

| Read | | |
|---|---|---|
| | select(right bit) | unselect |
| 106a node | 0v to Vcc | Vcc |
| 106b node | Vcc | Vcc |
| CG | 0v to Vcc | 0v to Vcc |
| SG0 | 0v to -2v | Vcc |
| SG1 | 0v to -2v | Vcc |
| well | Vcc | Vcc |

Note:
1. Vnn = -4.5v to -10v
2. Vpp = 4v to 11v

N-Type Diffusion

| Erase(electrons ejected from floating gate) | | |
|---|---|---|
| | select | unselect |
| 106a node | x or Vpp | 0v |
| 106b node | Vpp or 0v | 0v |
| CG | Vnn | Vpp or vcc |
| SG0 | Vpp or 0v | 0v |
| SG1 | Vpp or 0v | 0v |
| well | Vpp | Vpp or Vcc |

| Channel program | | |
|---|---|---|
| | select | unselect |
| 106a node | x | x |
| 106b node | Vnn | 0v or Vnn |
| CG | Vpp | Vnn |
| well | Vnn | Vnn |

| Channel hot electron (CHE) program (electrons injected to floating gate) | | |
|---|---|---|
| | select(right bit) | unselect |
| 106a node | 0v | 0v |
| 106b node | Vpp | 0v |
| CG | Vppr | 0v to vpp |
| SG0 | vpp | 0v |
| SG1 | vpp | 0v |
| well | 0v | 0v |

| Read | | |
|---|---|---|
| | select(right bit) | unselect |
| 106a node | 0v to Vcc | 0v |
| 106b node | 0v | 0v |
| CG | 0v to Vcc+2v | 0v to Vcc+2v |
| SG0 | vcc | 0v |
| SG1 | vcc | 0v |
| well | 0v | 0v |

3. Vppr = 0v to Vpp, ramp up or ramp down
* Vpp to Vpp+2v for memory string of FIG. 5

FIG. 9

MEMORY ARRAY OF NON-VOLATILE ELECTRICALLY ALTERABLE MEMORY CELLS FOR STORING MULTIPLE DATA

CROSS REFERENCE TO RELATED APPLICATION

This application is a divisional application of a co-pending U.S. patent application Ser. No. 10/801,789, Non-volatile Electrically Alterable Memory Cell For Storing Multiple Data And An Array Thereof, filed on Mar. 16, 2004, and claims the benefit thereof.

BACKGROUND OF THE INVENTION

1. Field of the Invention

The present invention relates to logic gate structures, and more particularly, to an electrically erasable and programmable read-only memory (EEPROM) and to Flash EEPROMs employing metal-oxide-semiconductor (MOS) floating gate structures.

2. Description of the Related Art

Electrically erasable and programmable non-volatile semiconductor devices, such Flash EEPROMs are well known in the art. One type of Flash EEPROM employs metal-oxide-semiconductor (MOS) floating gate devices. Typically, electrical charge is transferred into an electrically isolated (floating) gate to represent one binary state while an uncharged gate represents the other binary state. The floating gate is generally placed above and between two regions (source and drain) spaced-apart from each other and separated from those regions by a thin insulating layer, such as a thin oxide layer. An overlying gate is disposed above the floating gate provides capacitive coupling to the floating gate, allowing an electric field to be established across the thin insulating layer. "Carriers" from a channel region under the floating gate are tunneled through the thin insulating layer into the floating gate to charge the floating gate. The presence of the charge in the floating gate indicates the logic state of the floating gate, i.e., 0 or 1.

Several methods can be employed to erase the charge in a floating gate. One method applies ground potential to two regions and a high positive voltage to the overlying gate. The high positive voltage induces charge carriers, through the Fowler-Nordheim tunneling mechanism, on the floating gate to tunnel through an insulating layer that separates the overlying gate and the floating gate into the overlying gate. Another method applies a positive high voltage to a source region and grounds the overlying gate. The electric field across the layer that separates the source region and the floating gate is sufficient to cause the tunneling of electrons from the floating gate into the source region.

Typically, one control gate and one floating gate form a memory cell and store only one piece of data. Accordingly, to store a large number of data, a large number of memory cells are needed. Another problem faced with traditional memory cells is miniaturization. Shrinking the scale of transistors has made it more difficult to program the floating gate devices, and reduces the ability of the floating gate devices to hold a charge. When the overlaying gate cannot induce enough voltage onto the floating gate, the floating gate cannot retain enough charge for a meaningful read-out. Therefore, the traditional transistor layout is reaching a limitation in miniaturization.

SUMMARY OF THE INVENTION

In one aspect, the invention is an electrically alterable memory device. The memory device includes a semiconductor substrate and a semiconductor well. The semiconductor substrate is doped with a first dopant in a first concentration, and a semiconductor well, adjacent the semiconductor substrate, is doped with a second dopant that has an opposite electrical characteristic than the first dopant. The semiconductor well having a top side on which two spaced-apart diffusion regions are embedded. Each diffusion region is doped with the first dopant in a second concentration greater than the first concentration. The two diffusion regions includes a first diffusion region and a second diffusion region, and a first channel region is defined between the first diffusion region and the second diffusion region. The memory device also includes a first floating gate, a second floating gate, and a control gate. The first floating gate is disposed adjacent the first diffusion region and above the first channel region and separated therefrom by a first insulator region. The first floating gate has a first height and is made from a conductive material and capable of storing electrical charge. The second floating gate is disposed adjacent the second diffusion region and above the first channel region and separated therefrom by a second insulator region. The second floating gate has a second height and is made from a conductive material and capable of storing electrical charge. The control gate is disposed laterally between the first floating gate and the second floating gate. The control gate is separated from the first floating gate by a first vertical insulator layer and separated from the second floating gate by a second vertical insulator layer. The control gate is disposed above the first channel region and separated therefrom by a third insulator region. The control gate has a third height and is made from a conductive material.

In another aspect, the invention is an electrically alterable memory string. The memory string includes a plurality of memory devices, each memory device having a control transistor capable of storing a plurality of data. The plurality of memory devices has a first end and a second end. A first select transistor connected to the first end, a second select transistor connected to the second end, and a connector connecting the first select transistor to a bit line.

In another aspect, the invention is an electrically alterable non-volatile memory array. The memory array includes a plurality of memory strings, each memory string having a fast connector connected to a drain of a first select transistor in the memory string, a second connector connected to a gate of the first select transistor, a third connector connected to a gate of a memory cell transistor in the memory string, and a fourth connector connected to a gate of a second select transistor in the memory string. The plurality of memory strings are arranged in such way that the drain of the first select transistor in a fast memory string is connected to a source of the second select transistor in an adjacent second memory string. The memory array also includes a plurality of bit lines, wherein each bit line being connected to the first connector of every memory string, a plurality of first select lines, wherein each first select line being connected to the second connector of every memory string, a plurality of control lines, where each control line being connected to the third connector of every memory string, and a plurality of second select lines, wherein each second select line being connected to the fourth connector of every memory string.

Other advantages and features of the present invention will become apparent after review of the hereinafter set forth Brief Description of the Drawings, Detailed Description of the Invention, and the Claims.

BRIEF DESCRIPTION OF THE DRAWINGS

FIG. 9 lists several combinations of operational voltages according to one embodiment of the invention.

DETAILED DESCRIPTION OF THE INVENTION

Figure 1:
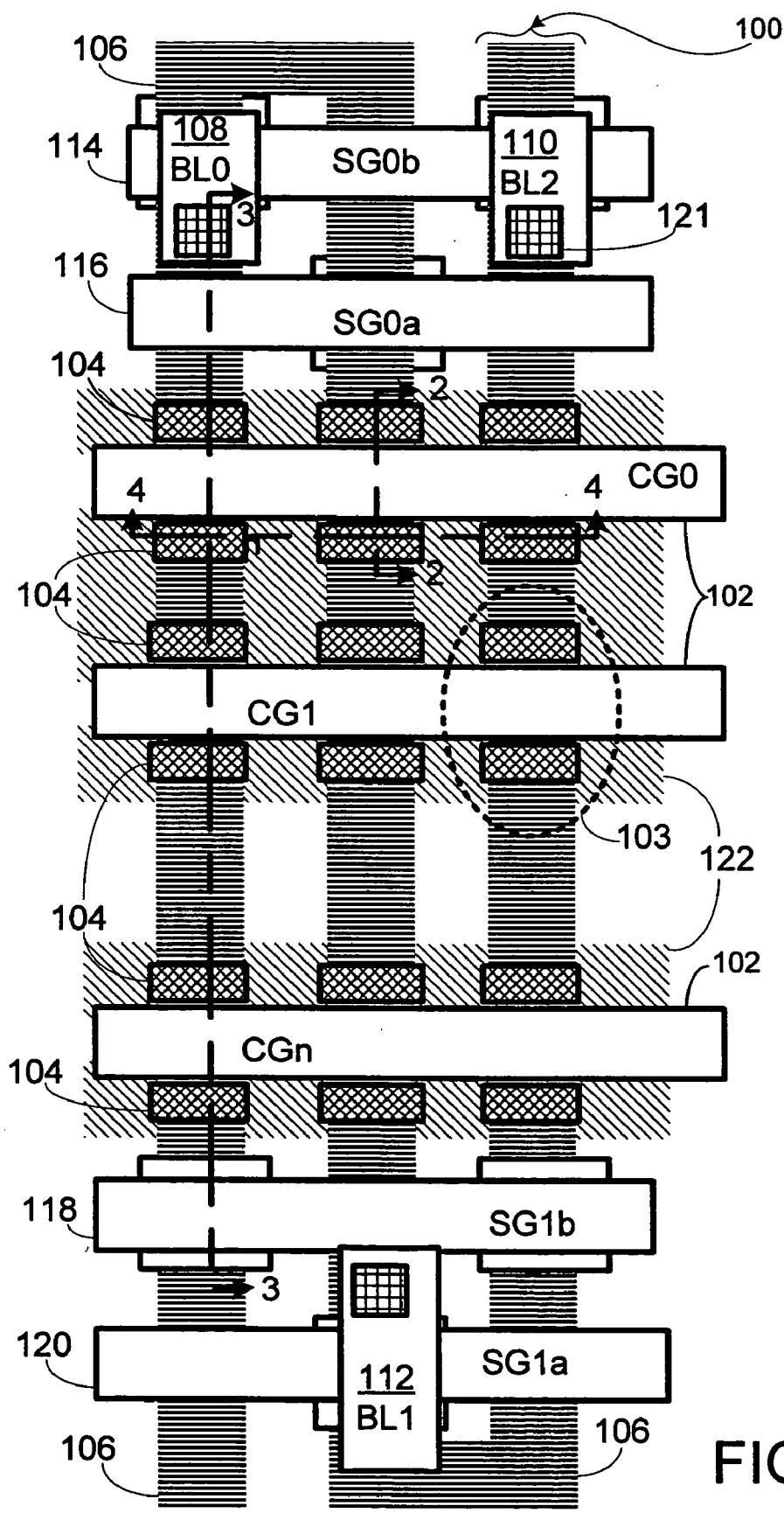
FIG. 1 is a top plan view of a plurality of memory strings according to one embodiment of the invention.

Three electrically programmable and erasable non-volatile memory strings are shown in FIG. 1. Each memory string 100 includes an active region 106 running vertically and a plurality of control gates 102 running horizontally across multiple memory strings. The active region is heavily doped with a first dopant. The control gate is formed by polysilicon or other suitable material. A plurality of floating gates 104 are disposed adjacent to the control gate 102 and over the active region 106. Each control gate 102 is surrounded by two floating gates 104 on two sides.

The combination of two floating gates 104 surrounding one control gate 102 over one area of the active region 106 forms a memory cell 103. Each memory cell 103 stores two data, one on each floating gate 104. Each memory string 100 may have many memory cells 103. The memory cells 103 on a memory string 100 are delimited by a first select gate 116 and a second select gate 120. The first select gate 116 and the second select gate 120 run horizontally over all memory strings 100 and over the active region 106. The area of the active region 106 not covered by the floating gates 104, the control gates 102, and the select gates 114, 116, 118, 120 are doped diffusion regions. A vertical connector 121 connects the active region 106 to a bit line 110 that runs vertically through multiple memory strings 100.

Each memory string 100 is connected to an adjacent memory string 100 through the active region 106. The separation of memory cells 103 in one memory string 100 from memory cells 103 of an adjacent memory string 100 may be accomplished through an isolation layer 122, such as localized oxidation (LOCOS), recessed LOCOS, shallow trench isolation (STI), or full oxide isolation. A plurality of memory strings 100 may form a high density memory array.

Figure 2A:
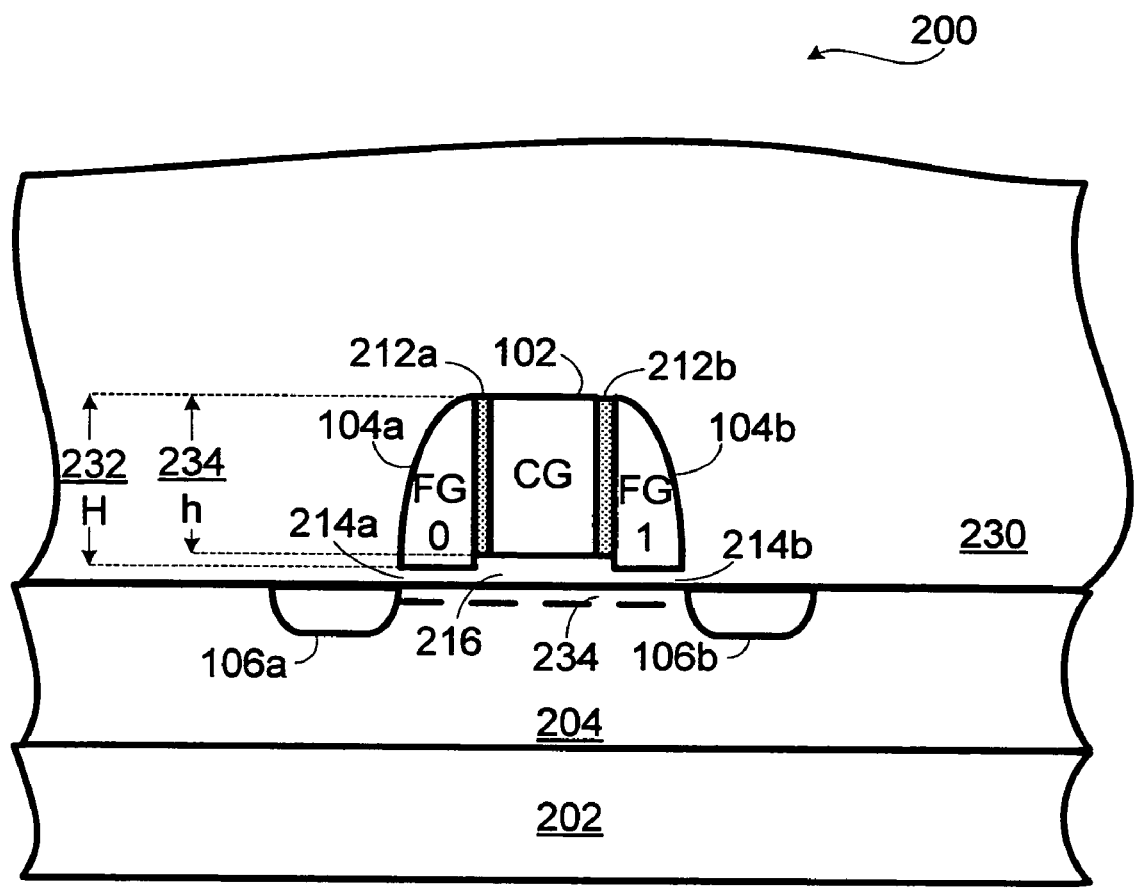
FIG. 2A is a cross sectional view of the memory string taken along line 2-2 of FIG. 1.

FIG. 2A is a cross section view 200 of a memory cell 103 taken along line 2-2 in FIG. 1. The memory cell 103 includes a semiconductor substrate 202 and a well 204 on the top of the substrate 202. The substrate is doped with a first dopant, which can be either N type or P type. The well 204 is a semiconductor doped with a second dopant with an electrical characteristic that is opposite of the first dopant. Two spaced-apart diffusion regions 106a and 106b, which are part of the active region 106, are placed on the top side of the well 204. The diffusion regions 106a, 106b are doped with the same dopant used for doping the substrate 202 but doped with a concentration that is higher than that of the substrate 202. A channel region 234 is defined between two diffusion regions 106a, 106b. An insulating layer 230 is placed on the top of the well 204 and the diffusion regions 106a, 106b. The insulating layer 230 may be formed by an insulating oxide material or other suitable insulating materials. Though FIG. 2A illustrates the diffusion regions 106a, 106b implemented in a single well, it is understood that other implementations, such as twin wells, triple wells, or oxide isolation well may also be used. The separation of active devices may be accomplished through localized oxidation (LOCOS), recessed LOCOS, shallow trench isolation (STI), or full oxide isolation. A first floating gate 104a of polysilicon material is placed above the channel region 234 and adjacent diffusion region 106a. The first floating gate 104a may overlap slightly with the diffusion region 106a; however, excessive overlapping may reduce the length of the channel region 234. The first floating gate 104a is separated from the channel region 234 by a tunnel channel 214a (also known as tunnel oxide) of the insulating layer 230. The thickness of the tunnel channel 214a should be thin enough to allow removal of electrons from the first floating gate 104a under the Fowler-Nordheim tunneling mechanism, but thick enough to prevent the occurrence of a leakage current between the first floating gate 104a and the well 204. The length of the tunnel channel 214a under the first floating gate 104a can be smaller than one lambda, where the lambda is defined by the technology used. For example, if the technology uses 0.18 µm, then one lambda is defined as 0.18 µm.

A second floating gate 104b of polysilicon material is placed above the channel region 234 and adjacent diffusion region 106b. The second floating gate 104b may overlap slightly with the diffusion region 106b; however, excessive overlapping may reduce the length of the channel region 234. The second floating gate 104b is separated from the channel region 234 by a tunnel channel 214b (also known as tunnel oxide) of the insulating layer 230. The thickness of the tunnel channel 214b should be thin enough to allow removal of electrons from the first floating gate 104b under the Fowler-Nordheim tunneling mechanism, but thick enough to prevent the occurrence of a leakage current between the second floating gate 104b and the well 204.

A control gate 102 is placed above the channel region 234, laterally between the first floating gate 104a and the second floating gate 104b. The control gate 102 is separated from the first floating gate 104a by a first vertical insulating layer 212a and from the second floating gate 104b by a second vertical insulating layer 212b. The insulating layers 212a, 212b can be oxide-nitride-oxide or other suitable material. The control gate 102 is separated from the channel region 234 by a separation channel 216 (also known as separation oxide) of the insulating layer 230. The thickness of the separation channel 216 should be thick enough to sustain the stress from the control gate's 102 voltage variation. The voltage at the control gate 102 may vary during operation of the memory cell 103 and cause stress on the separation channel 216, thus leading to the deterioration of the separation channel 216. The control gate 102 may be formed by a polysilicon grown at a different stage as the floating gates 104a, 104b. The control gate 102 is connected to control gates in other memory cells in different memory strings. The control gate 102 is surrounded by two floating gates 104a, 104b.

The fast floating gate 104a has a first height measured from its bottom edge to its top edge and the second floating gate 104b has second height also measured from its bottom edge to its top edge. The control gate 102 has a third height measured from its bottom edge to its top edge. The first height, the second height, and the third height may be identical or may be different. The first height and the second height may be taller or shorter than the third height.

Figure 2B:
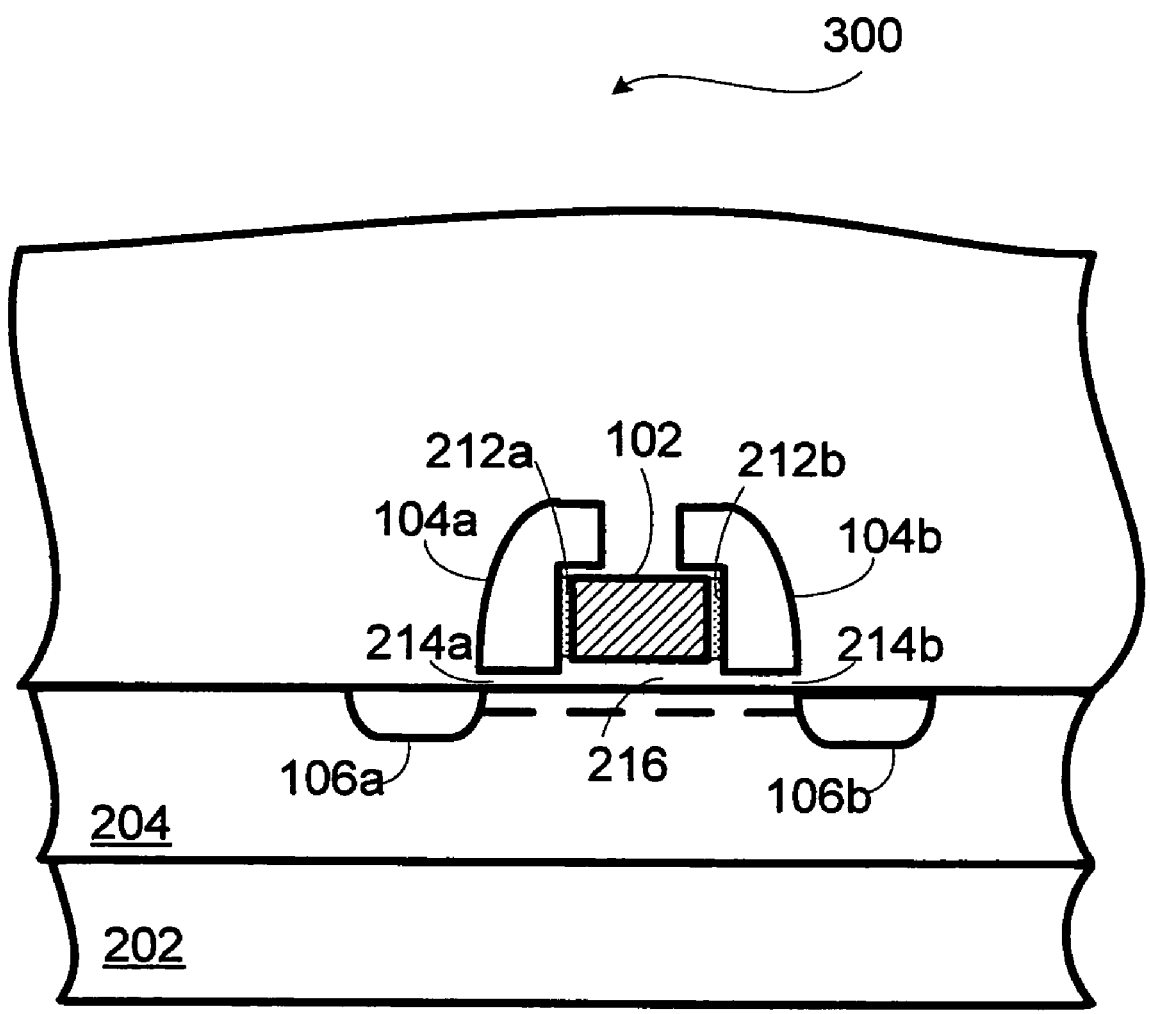
FIG. 2B is a cross sectional view of an alternative embodiment of the memory string taken along line 2-2 of FIG. 1.

The cross section view of one alternative embodiments of the memory cell 103 taken along line 2-2 in FIG. 1 is shown in FIG. 2B. FIG. 2B illustrates a cross section view 300, where each floating gate 104a and 104b surrounds the control gate 102 on more than one lateral side. Because of greater exposure of the surface of a floating gate 104a, 104b to the control gate 102, greater the coupling ratio between the control gate's voltage and the floating gate voltage can be achieved.

Referring back to FIG. 2A, when a voltage is applied to the control gate 102, through a coupling effect, a voltage is induced on the floating gates 104a, 104b. The voltage induced depends on a coupling ratio between the control gate 102 and the floating gate 104a. The coupling ratio is defined as the capacitance ratio between the capacitance between the control gate 102 and the floating gate 104a and the capacitance between the floating gate 104a and the substrate 204.

C(CG/FG)=capacitance between the control gate and the floating gate
C(FG/Substrate)=capacitance between the floating gate and the substrate
Gamma=coupling ratio $$\text{Gamma} = \frac{C\left(\frac{CG}{FG}\right)}{C\left(\frac{CG}{FG}\right) + C\left(\frac{FG}{\text{Substrate}}\right)}$$

When a $V_{CG}$ is applied to the control gate, the voltage at the floating gate is:

$V_{FG} = V_{CG} \times \text{Gamma}$

The coupling effect depends on the thickness of the layers 212a, 212b separating the control gate 102 from the floating gates 104a, 104b and the area on each floating gate 104a, 104b exposed to the coupling effect. The coupling effect can be easily increased by increasing the area of the floating gate 210 exposed to the control gate 212, and the area of the floating gate 210 exposed to the control gate 212 may be increased by increasing the height 234 of the control gate 212 and the height 232 of the floating gate 210. A capacitor is formed between the control gate 102 and each floating gate 104a, 104b. When a floating gate 104a, 104b is surrounded by a control gate 102 in more than one lateral side, the coupling effect is increased and the capacitance between the floating gate 104a, 104b and the control gate 102 is increased. If the layer 212a, 212b separating the control gate 102 and the floating gate 104a, 104b is too thin, a leakage current may occur between the floating gate 104a, 104b and the control gate 102 when the floating gate 104a, 104b is charged with electrons. If the layer 212a, 212b is too thick, the coupling ratio may be low, resulting in a low voltage in the floating gate. One workable coupling ratio is between 50%-80%, i.e., 10 V applied to the control gate 102 results in 5 V to 8 V induced in the floating gate 104a, 104b. The combination of the control gate 102, the floating gates 104a, 104b, and the diffusion regions 106a, 106b forms a control transistor. The control transistor is capable of holding two data independently, one in each floating gate 104a, 104b. Each floating gate 104a, 104b may be independently programmed.

The induction of voltage on the floating gate 104a, 104b is important when erasing or programming a memory cell 103. When programming the floating gate 104b of a memory cell 103 of N-type diffusion, a positive high voltage (Vpp) between 4V and 11V is applied to the control gate 102, and the diffusion region 106a and the well 204 are left at 0 V. A positive high voltage between 4V and 11V is also applied to the diffusion region 106b. The positive high voltage depends on the technology used. A voltage is induced to the floating gates 104a, 104b by the Vpp at the control gate 102 through the coupling effect. When the control gate 102 is at the Vpp and inducing voltages onto the floating gates 104a, 104b, the channel 234 between the diffusion regions 106a and 106b are conductive. With the channel 234 being conductive and the diffusion region 106b at the Vpp, electrons flow between the diffusion regions 106a, 106b, and the phenomenon of impact ionization (several occurrences) occurs near the diffusion region 106b. The impact ionization occurs when charge carriers moving toward the diffusion region 106b generate electron-hole pairs from the lattice near the drain junction (diffusion region 106b). The generated carriers look for high positive voltage and are injected into the floating gate 104b. The carriers emitted from the source region 106a experience lateral electrical field between the diffusion regions 106a and 106b. The average carder energy is higher near the drain junction of the diffusion region 106b. The impact ionization tends to occur near the diffusion region 106b. Of free electrons, only lucky few will be injected into the floating gate 104b, and this is known as Lucky electron model. The amount of electrons injected into the floating gate 104b depends on the positive high voltage applied to the control gate 102 and the duration of this positive high voltage. To program the floating gate 104a, the similar process may be used but the voltages at the diffusion regions 106a and 106b are reversed, i.e., a positive high voltage is applied to the diffusion region 106a while the diffusion region 106b and the well 204 are at zero volt.

A ramping positive high voltage (Vppr) may be applied to the control gate 102 to program a floating gate 104b in a memory cell of P-type diffusion. A positive high voltage between 4V and 11V is initially applied to the control gate 102, and this positive high voltage is gradually ramped down to 0V and then ramped up back to 4V-11V. A positive high voltage is applied to the diffusion region 106a and 0V is applied to the diffusion region 106b. When the control gate 102 is at the positive high voltage of 4V-11V, a voltage is induced onto the floating gate 104b and the channel 234 between the diffusion regions 106a and 106b is turned off. Although the floating gate 104b is at a positive voltage level, no electrons are injected into the floating gate 104b because the channel 234 is off and there is no flow of electrons between the diffusion regions 106a and 106b. As the voltage at the control gate 102 ramps down, the potential difference between the control gate 102 and the well 204 turns on the channel between the diffusion regions 106a and 106b, and electrons start to flow in the channel 234. The voltage at the floating gate 104b also drops as the voltage at the control gate 102 ramps down, but the voltage at the floating gate 104b is still sufficient to cause some high energy electrons (also known as hot electrons) to be injected into the floating gate 104b. When the control gate 102 reaches zero voltage, the channel 234 is turned on, but no electrons are injected into the floating gate 104b because the floating gate 104b is also at zero voltage. When the voltage at the control gate 102 starts to ramp up back to 4V-11V, the voltage at the floating gate 104b also ramps up, and high energy electrons from the channel 234 start to be injected into the floating gate 104b again. When the control gate 102 is at positive high voltage of 4V-11V, the channel 234 is turned off, electrons stop flowing, and no more electrons are injected into the floating gate 104b. The number of electrons injected into the floating gate 104b depends on the duration of the ramp down/up process and the concentration of dopants in the channel region. This voltage ramping process may be repeated for the floating gate to retain enough charge to represent a logic state properly. Once charges of electrons are inside of the floating gate 104b, the floating gate 104b may hold the charges for years. The voltage ramping may also be used to program memory cells of N-type diffusion.

The amount of charge injected into a floating gate 104a, determines the threshold voltage for the control transistor formed by the control gate 102, the floating gates 104a, 104b, and the diffusion regions 106a, 106b. The floating gate 104a may hold different amount of charges, thus having different threshold voltages. In one embodiment of the invention, through repeating the voltage ramping process, the floating gate 104a may have four different levels of threshold voltages and capable of representing four logic states. The four logic states may be read and distinguished by measuring the current flowing between the diffusion regions 106a, 106b.

A P-type diffusion memory cell may also be programmed with a different mechanism. Applying a negative voltage between −1V and −10V to diffusion region 106b, a positive high voltage to the control gate 102, and a voltage between 0V and Vcc to the well 204, charges can be programmed into floating gate 104b. The high positive voltage of the control gate 102 induces a voltage into the floating gate 104b. The difference of potential between the well 204 and the diffusion region 106b causes a soft avalanche breakdown between the diffusion region 106b (P-type) and the well 204 (N-type). Some of the electrons from this soft breakdown are injected into the floating gate 104b because the floating gate 104b is at higher voltage.

A negative voltage is applied between −4.5V and −10V to the control gate 102, a positive high voltage is applied to the well 204 when it is desired to erase charges in the memory cell 103 of N-type diffusion. The negative voltage at the control gate 103 is induced to the floating gates 104a, 104b. The combination of an induced negative voltage at the floating gates 104a, 104b and positive high voltages at the well 204 forces electrons out of the floating gates 104a. 104b and into the well 204, thus removing the electrons from the floating gates 104a, 104b. The electrons are removed through the Fowler-Nordheim tunneling mechanism.

A negative voltage is applied between −4.5V and −10V to the control gate 102, a positive high voltage is applied to the well 204 and the diffusion regions 106a, 106b when it is desired to erase charges in the memory cell 103 of P-type diffusion. The mechanism to remove the electrons is similar to what has been described above for the N-type diffusion except that the positive high voltage is needed at the diffusion regions 106a and 106b because otherwise the channel 234 may be floating at an unknown voltage and impeding the exit of electrons from the floating gates 104a, 104b.

When it is desired to read the content from a floating gate 104a of a memory cell 103, a voltage between 0V and Vcc is applied to the control gate 102, a voltage between 0 V to Vcc is applied to diffusion region 106b, and 0V to −2V is applied to two select gates (not shown in FIG. 2A) in the memory string, one at each end of the memory string. The voltage at the control gate 102 turns on the portion of the channel 234 under it. The threshold voltage (Vt) for the floating gate 104b is lowered because of drain-induced barrier lowering (DIBL) and a depletion region is created under the floating gate 104b. If the floating gate 104a has charge, the portion of the channel 234 under it will be on and a current flows from diffusion region 106b to diffusion region 106a. The channel 234 under the floating gate 104a and the control gate 102 is on, the current passes under the floating gate 104a and the control gate 102, and then enter the depletion region under the floating gate 104b. The current will continue to flow through the depletion region under the floating gate 104a toward the diffusion region 106a. Because the select gates are at 0V to −2V, the current resulting from the electron flow is sensed by a bit line and a sense-amplifier connected to the bit line. The data stored in the floating gate 104a comes out from the drain of the control transistor. When the floating gate 104a is programmed to store different levels of charge and thus with different levels of threshold voltage, the intensity of the current flowing between diffusion region 106a and diffusion region 106b depends on the threshold voltage of the floating gate 104a. The intensity of this current can be sensed by the sense-amplifier, thus the logic level of the floating gate 104a determined.

If the floating gate 104a is without charge, then the portion of the channel 234 under the floating gate 104a will not be turned on and there will be no current or small leakage current flowing between diffusion region 106b and diffusion region 106a. The leakage current should be different from the current flowing when the floating gate 104a is charged. If the floating gate 104a is not charged, then no channel is established between the diffusion regions 106a and 106b and the sense-amplifier will not be able to detect any current. The absence of a current between the diffusion regions 106a and 106b indicates the floating gate 104a is without electrons. A floating gate 104a with electrons is assigned to a first logic state while a floating gate 104a without electrons or with too few electrons is assigned to an opposite second logic state. Other operations not described here can be easily understood based on voltages listed in FIG. 9 and operations described above by those skilled in the art. When reading the content of a floating gate 104a in an N-type diffusion device, 0V is applied to 106a, and 1V to 2.5V is applied to 106b. The voltage in the diffusion region 106b will lower the threshold voltage of the floating gate 104b because of DIBL effect.

Figure 3:
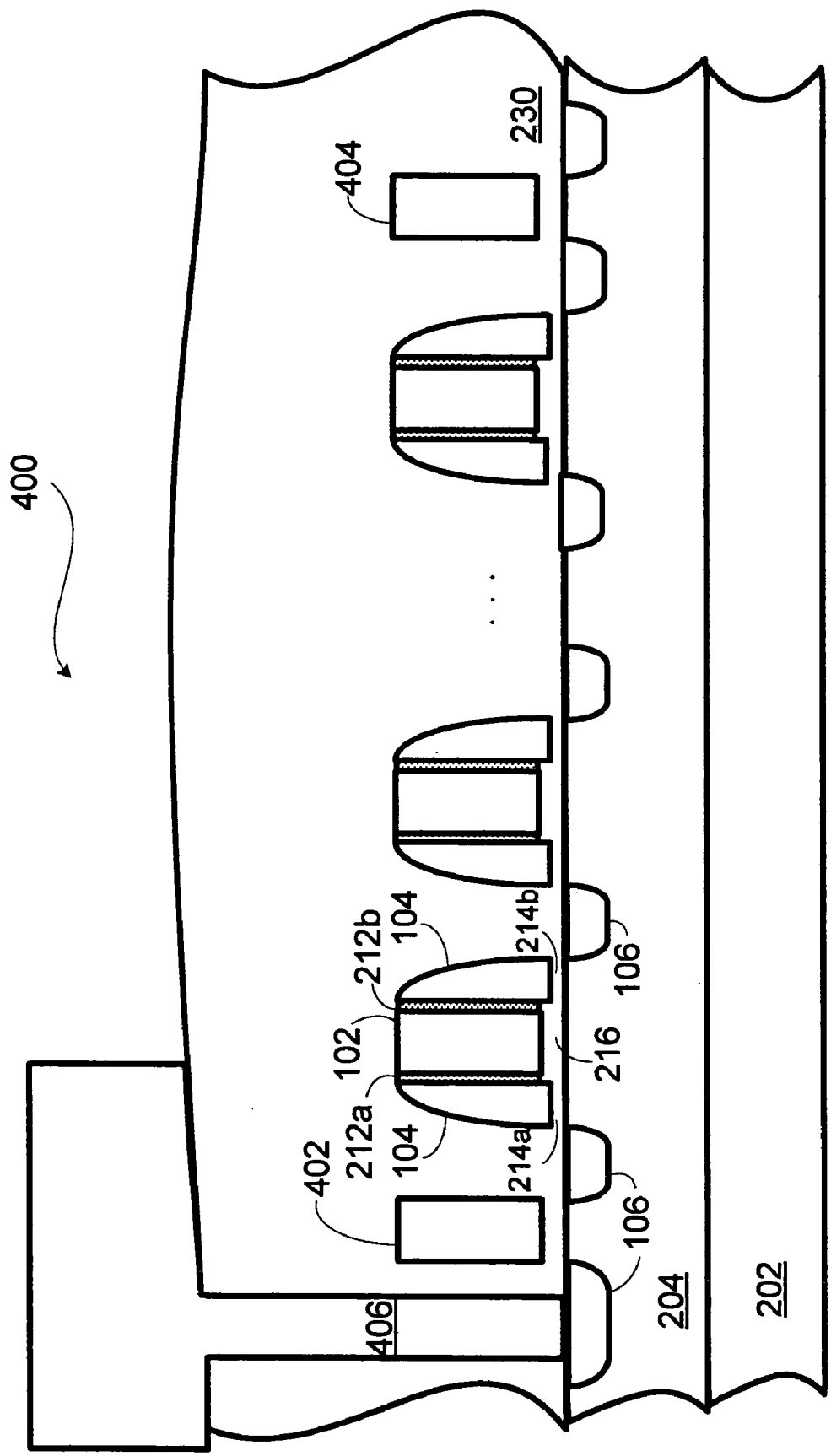
FIG. 3 is a cross sectional view of the memory string taken along line 3-3 of FIG. 1.
Figure 4:
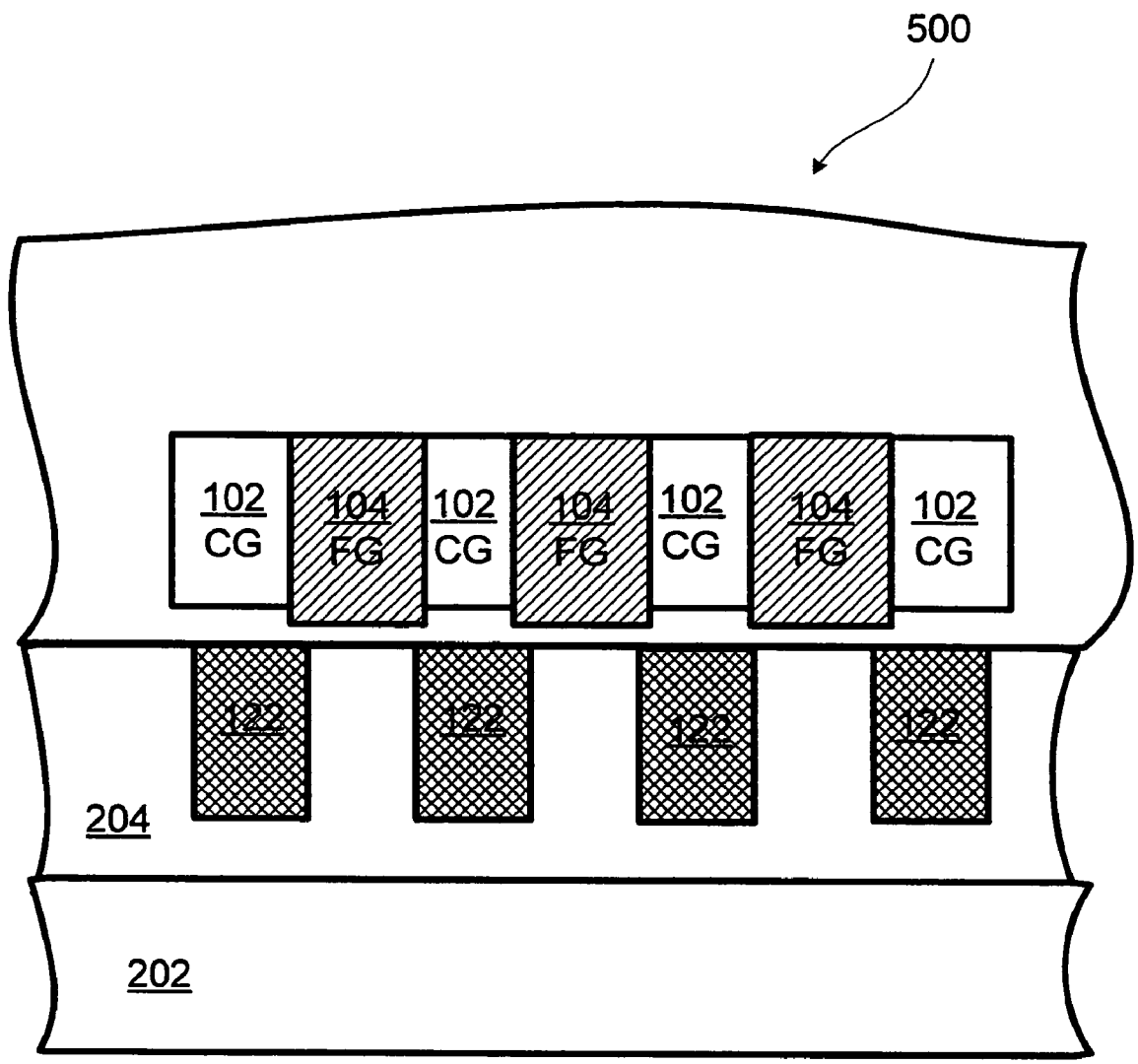
FIG. 4 is a cross sectional view of the memory string taken along line 4-4 of FIG. 1.

FIG. 3 is a cross section view 400 taken along line 3-3 in FIG. 1. FIG. 3 illustrates a cross section view of a memory string 100. The memory string 100 includes a substrate 202 doped with a first dopant, which can be either N type or P type, and a well 204 doped with a second dopant with an electrical characteristic that is opposite of the first dopant. A plurality of diffusion regions 106, which are part of the active region 106 in FIG. 1, are placed on the top side of the well 204. The diffusion regions 106 are doped with the same dopant used for doping the substrate 202 but doped with a concentration that is higher than that of the substrate 202. A plurality of control transistors are placed adjacent each other. Each control transistor includes a control gate 102, two floating gates 104, and two diffusion regions 106, one diffusion region being the drain of the control transistor while the other diffusion region is the source. Two adjacent control transistors share one common diffusion region 106. Each control transistor is a memory cell. There is one select transistor 402 at one end of this "string" of memory ceils and another select transistor 404 at the other end of the string of memory cells. There is a vertical contact 406 connecting one diffusion region 106 at the end of the memory string to a bit line 108 in FIG. 1. A diffusion region 106 from one memory string 100 is connected to a diffusion region 106 of an adjacent memory string 100 (shown in FIG. 1). FIG. 4 is a cross section view 500 taken along line 4-4 in FIG. 1. It is shown that memory strings represented by a floating gate 104 are separated from each other by isolation layers 122.

Figure 5:
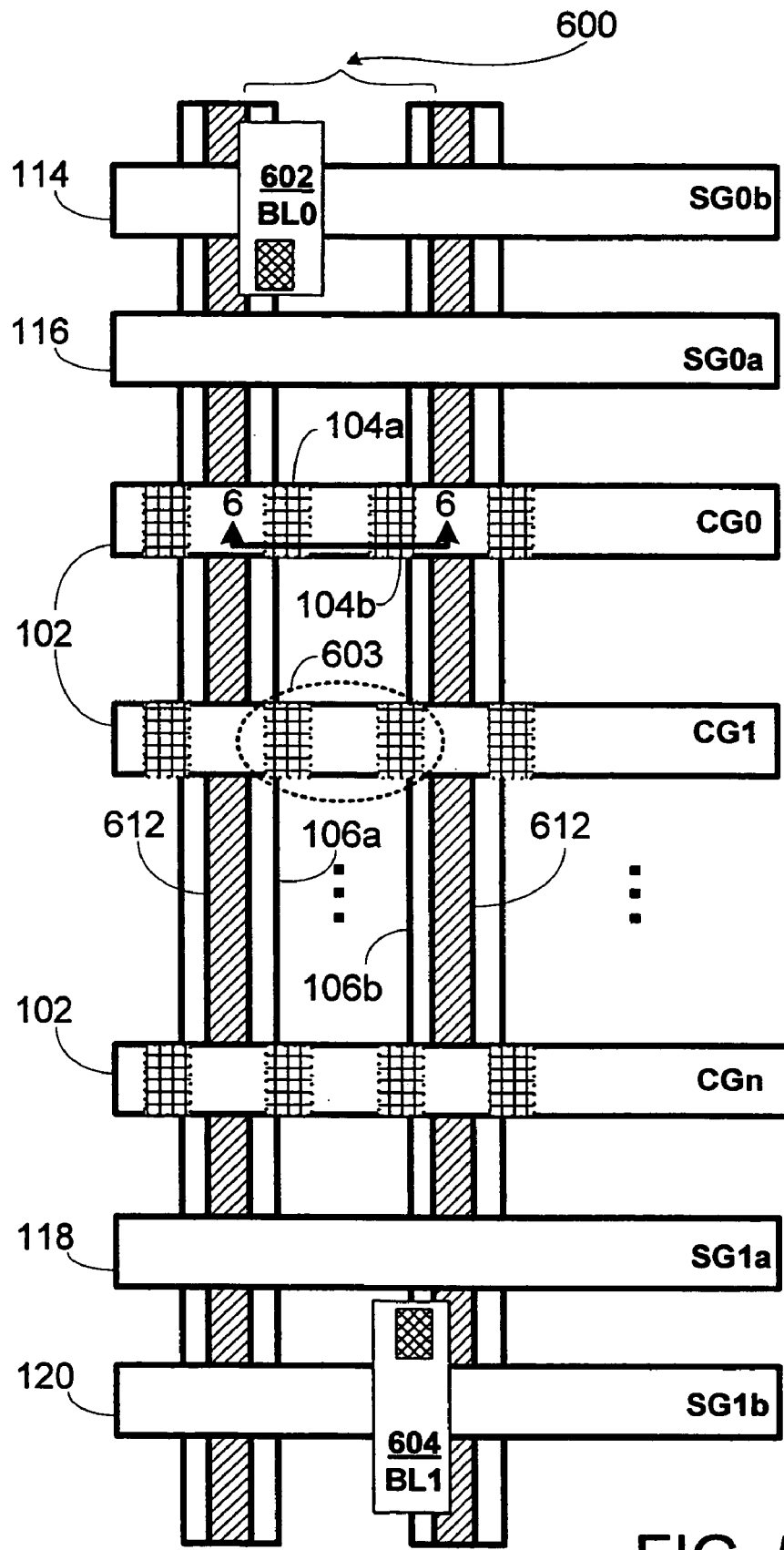
FIG. 5 is a top plan view of a plurality of memory strings according to one alternative embodiment of the invention.

FIG. 5 is a top plan view of an alternative embodiment of the invention. In this embodiment the memory ceils 603 in one memory string 600 are between two diffusion regions 106a, 106b. Each control gate 102 runs horizontally in FIG. 5 and across different memory strings 600. Each memory string 600 is delimited by two select gate transistors SG0a, SG1a in a manner similar as that depicted in FIG. 1. One STI 612 separates one diffusion region of one memory string 600 from a diffusion region for an adjacent memory string. The diffusion region 106a is connected to a bit line 602 through a buried contact and the diffusion region 106b is connected to a bit line 604 also through a buried contact. When it is desirable to read a data from a floating gate 104b of a memory cell 603, the control gate 102 for the selected memory cell is turned on. A bit line 604 is connected to a source voltage. The voltage at the bit line 604 is propagated through the diffusion region 106b to the memory cell 603. The read operation at the memory cell 603 is similar to that described for FIG. 2. The data is read from the drain of the control gate transistor, bit line 602. The program and ease operations for the embodiment of FIG. 5 are same as those previously described for FIG. 2. For the embodiment of FIG. 5, there is no need to turn on the control transistors of unselected memory cells. As matter of fact, the control transistors of unselected memory cells are turned off to prevent short between diffusion regions 106a and 106b.

Figure 6A:
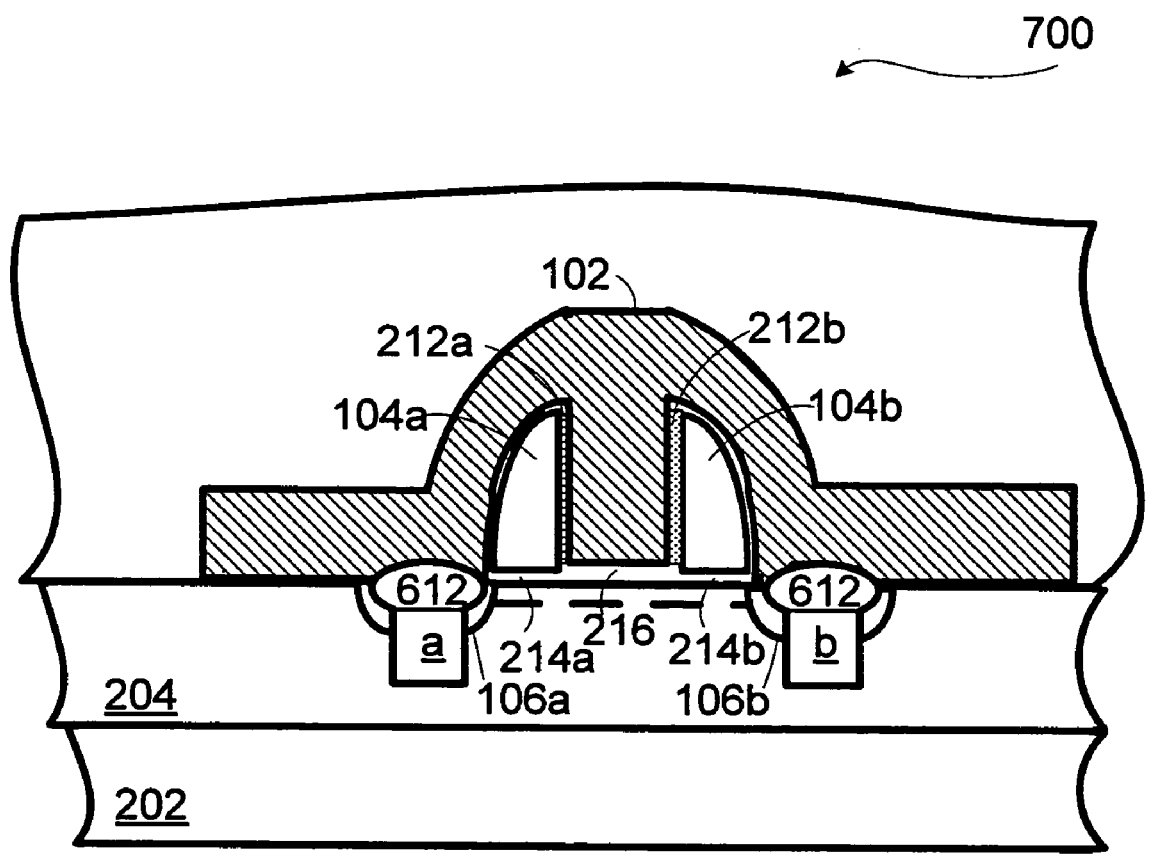
FIG. 6A is a cross sectional view of yet another alternative embodiment of the memory string taken along line 6-6 of FIG. 5.
Figure 6B:
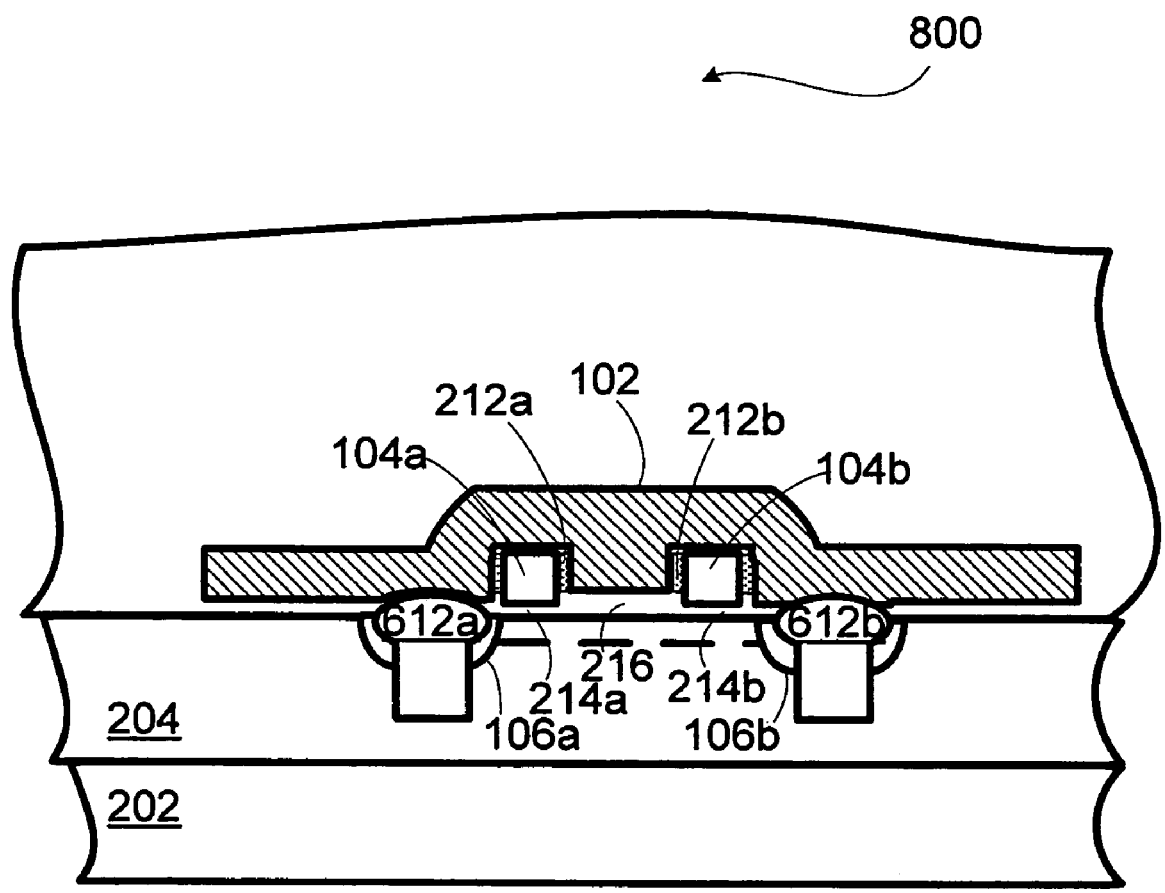
FIG. 6B is a cross sectional view of yet another alternative embodiment of the memory string taken along line 6-6 of FIG. 5.
Figure 6C:
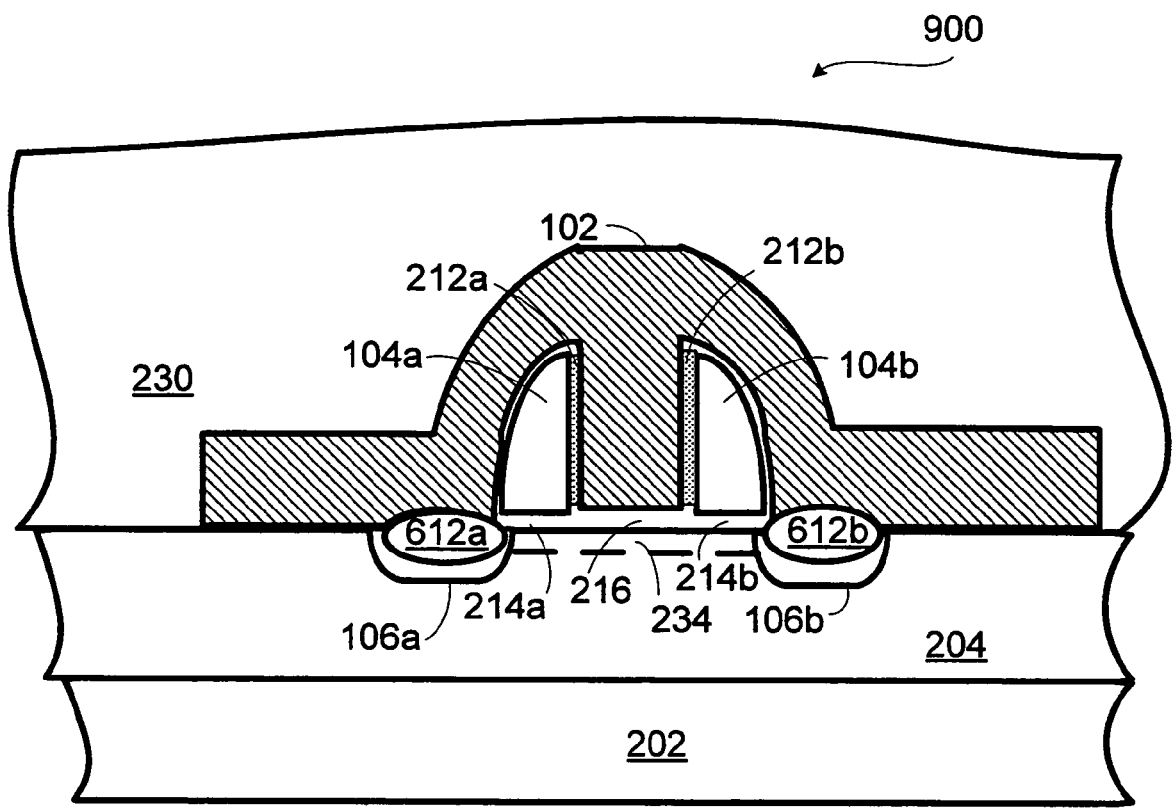
FIG. 6C is a cross sectional view of yet another alternative embodiment of the memory string taken along line 6-6 of FIG. 5.

FIG. 6A is a cross section view 700 taken along line 6-6 in FIG. 5. The floating gates 104a, 104b are surrounded by the control gate 102 from top and two lateral sides. FIG. 6B is a cross section view 800 of an alternative embodiment taken along line 6-6 in FIG. 5. FIG. 6C is a cross section view 900 of yet another alternative embodiment taken along line 6-6 in FIG. 5. It is also illustrated in FIG. 6C two oxidation sections 612a, 612b. Each oxidation section 612a disposed on the top of a diffusion region 106a. The oxidation section 612 does not divide a diffusion region 106 into two, but it does lessen the capacitance of the diffusion region 106. When the capacitance of a diffusion region 106 is smaller, the fast is the speed a data can be read out from a memory cell 603.

Figure 7:
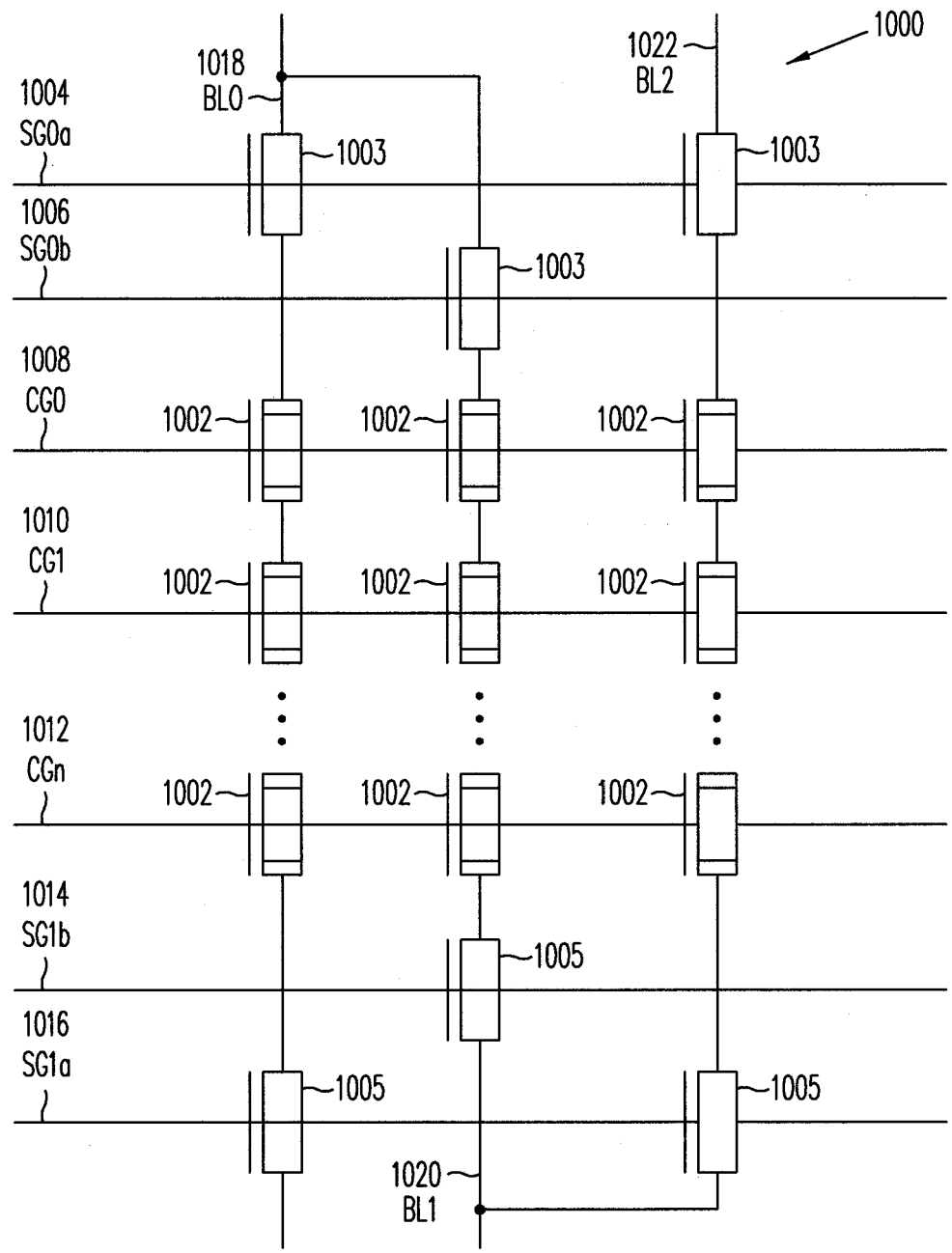
FIG. 7 is a schematic of a top plan of a plurality of memory cells according to one embodiment of the invention.
Figure 7:
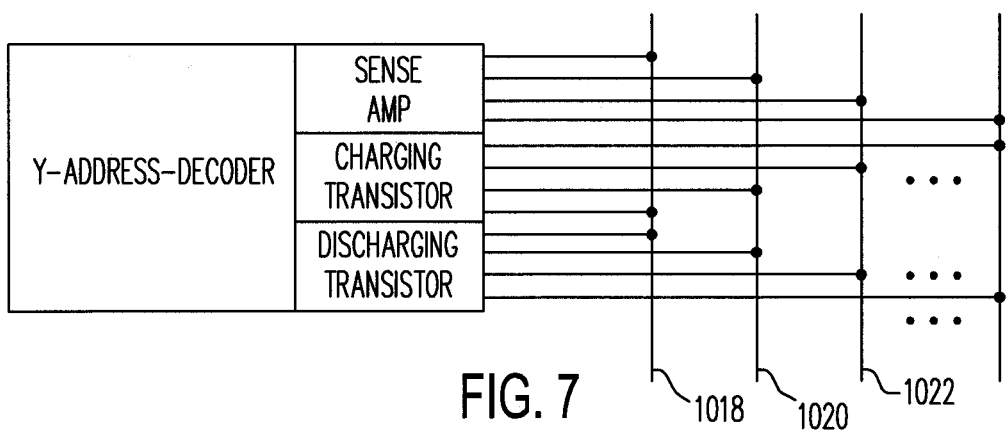

FIG. 7 is a schematic representation of part of a memory array 1000 made from the memory strings 100. Memory cells 1002 in one memory string (running vertically in FIG. 7) are interconnected. The drain of one memory cell is connected to the source of an adjacent memory cell. Each memory string includes two select transistors 1003, 1005 one at each end of the memory string. One end of the memory string is connected to a bit line 1018 and also connected to an adjacent memory string. The memory strings are disposed parallel to each other and the resulting memory array are organized in rows and columns. The select transistors 1003 of odd columns are controlled by one select line 1004, while the select transistors 1003 of even columns are controlled by another select line 1006. Similarly, the select transistors 1005 of odd columns are controlled by one select line 1016, while the select transistors 1005 of even columns are controlled by another select line 1014. The control transistors in one memory row are interconnected together and controlled by a control line. Data operations to one floating of a memory cell in one memory string is controlled by activating proper control line, select lines, and bit lines as described above for FIG. 2A. The activation of control lines and select lines depends on an X-address decoder (not shown) and the activation of bit lines depends on a Y-address decoder (not shown). Each bit line may be connected to a charging transistor and a discharging transistor (not shown) that are also controlled by the Y-address decoder.

Figure 8:
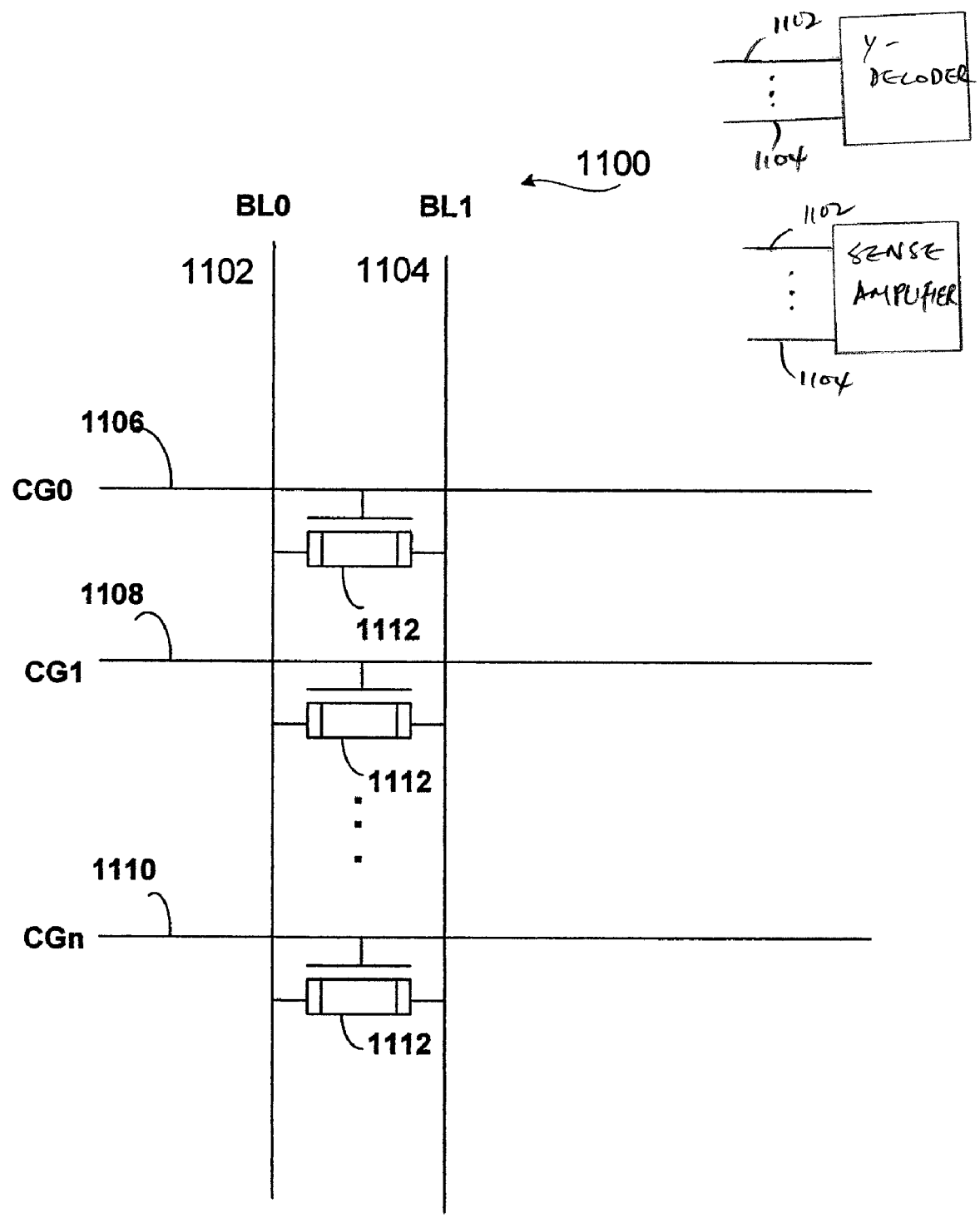
FIG. 8 is a schematic of a top plan of a plurality of memory cells according to one alternative embodiment of the invention.

FIG. 8 is a schematic presentation of a memory array 1100 made from memory strings 600. One side of a control transistor of the memory cell 1112 is connected to a bit line 1102, other side of the control transistor is connected to another bit line 1104, and the gate of the control transistor is connected to a control gate line 1106. Other select logics for enabling and selecting each memory cell are not shown in FIG. 8 but are easily understood by those skilled in the art.

The thickness of each gate (control gate, and floating gate) depends on the manufacturing process; currently most common thickness is about 3000 Angstroms or 0.3 micron. The thickness of the tunnel channels 214a, 214b depend also on manufacturing process. However, a preferred thickness for the tunnel channels 214a, 214b is between 70 Angstroms and 110 Angstroms. Similarly, the thickness of the insulating layer separating the control gate 102 from the well 204 is between 150 Angstroms and 250 Angstroms. The materials and measurements mentioned heretofore are for illustration purposes and not intended to limit the scope of the present invention. It is recognized that as technology evolves, other suitable materials and manufacturing processes may be employed to realize the present invention. It is also understood that the structures disclosed heretofore can be easily implemented by any of existing semiconductor manufacturing processes known to those skilled in the art. It is also understood that the voltages illustrated in FIG. 9 is for illustration purposes, and other voltage combinations may be used. For example, voltages may be reduced for embodiments that have a large coupling ratio, and small voltages make manufacturing easier and enhance reliability.

Although, the present application is described for Flash EEPROMs, it is understood that the invention is equally applicable for one-time-programmable (OTP) memories, multiple-time-programmable (MTP) memories, and other non-volatile memories.

While the invention has been particularly shown and described with reference to a preferred embodiment thereof, it will be understood by those skilled in the art that various changes in form and detail may be made without departing from the spirit and scope of the present invention as set forth in the following claims. Furthermore, although elements of the invention may be described or claimed in the singular, the plural is contemplated unless limitation to the singular is explicitly stated.

What is claimed is:

1. An electrically alterable, non-volatile memory array, comprising:
    a first memory string in a first column of the memory array and a second memory string being placed parallel the first memory string in a second column of the memory array, each memory string having:
        a first select transistor;
        a second select transistor;

a first conductor connected to a first drain or source terminal of the first select transistor, a first select line connected to a gate of the first select transistor, a control line connected to a gate of a memory cell transistor in the memory string, the memory cell transistor being one of a plurality of serially connected non-volatile memory transistors in the memory string connected between a second drain or source terminal of the first select transistor and a first drain or source terminal of the second select transistor, each memory transistor having two floating gates, a second select line connected to a gate of the second select transistor in the memory string, and a second conductor connected to a second drain or source terminal of the second select transistor; and wherein (i) the first conductor of the first memory string and the first conductor of the second memory string are electrically coupled to each other; (ii) the first select line of the first memory string and the first select line of the second memory string are electrically isolated; (iii) the second select line of the first memory string and the second select line of the second memory string are electrically isolated, and (iv) the second conductor of the first memory string and the second conductor of the second memory string are electrically isolated; and (v) the first and second conductors of each memory string are each coupled to a charging transistor, a discharging transistor and a sense amplifier.

2. The memory array of claim 1, wherein a memory cell transistor of the first memory string is separated from a memory cell transistor of the second memory string by an isolation layer.

3. The memory array of claim 2, wherein the isolation layer is a shallow trench isolation.

4. The memory array of claim 1, each floating gate being capable of storing different amounts of charge to allow representation of multiple data bits.

5. The memory array of claim 1, wherein gates of corresponding memory cells from the plurality of memory strings are connected to a common connector.

6. The memory array of claim 1, wherein the drain or source terminal of the second select transistor in the second memory string is connected through a diffusion region to the drain or source terminal of the second select transistor in an adjacent third memory string.

7. The memory array of claim 6, wherein the drain or source terminal of the second select transistor of the first memory string is connected through a diffusion region to the drain or source terminal of the first select transistor of an adjacent third memory string.

8. An electrically alterable, non-volatile memory array, comprising:

a first memory string in a first column of the memory array and a second memory string being placed parallel the first memory string in a second column of the memory array, each memory string having a first select transistor having a first source/drain region, a gate electrode, and a second source/drain region;

a second select transistor having a first source/drain region, a gate electrode and a second source/drain region; and a plurality of serially connected non-volatile, two-floating gate memory cells provided between, and serially connected to, the second source/drain region of the first select transistor and the second source/drain region of the second select transistor;

wherein (i) the first source/drain region of the first select transistor of the first memory string is electrically coupled to the first source/drain region of the first select transistor of the second memory string; (ii) the gate electrode of the first select transistor of the first memory string and the gate electrode of the first select transistor of the second memory string receive different signals; (iii) the gate electrode of the second select transistor of the first memory string and the gate electrode of the second select transistor of the second memory string receive different signals; (iv) the first source/drain region of the second select transistor of the first memory string is electrically isolated from to the first source/drain region of the second select transistor of the second memory string; and (v) in each memory string, the first source/drain region of the first select transistor and the first source/drain region of the second select transistors are each being configured (a) to be charged or discharged and (b) to provide a voltage representing a stored charge in either one of the two floating gates of one of the memory cells.

9. The memory array of claim 8, wherein each non-volatile memory cell of the first memory string is separated from another non-volatile memory cell of the second memory string by an isolation layer.

10. The memory array of claim 9, wherein the isolation layer comprises a shallow trench isolation.

11. The memory array of claim 8, wherein each floating gate in each non-volatile memory cell stores charge in different amounts to allow representation of multiple data bits.

12. The memory array of claim 8, wherein gate terminals of corresponding memory cells in the plurality of memory strings are connected by a common conductor.

13. The memory array of claim 8, wherein the first source/drain region of the first select transistor in the first memory string is connected through a diffusion region to the first source/drain region of the first select transistor in the second memory string.

14. The memory array of claim 13, wherein the first source/drain region of the second select transistor of the first memory string is connected through a diffusion region to the first source/drain region of the second select transistor of an adjacent third memory string.

15. An electrically alterable, non-volatile memory array, comprising:

a plurality of memory strings, including a first memory string and a second memory string, the first memory string and the second memory string being provided in parallel columns of the memory array and being electrically connected at one end of each memory string, each memory string having:

a first conductor connected to a first drain or source terminal of a first select transistor in the memory string;

a control line connected to a gate of a memory cell transistor in the memory string, the memory cell transistor being one of a plurality of serially connected non-volatile memory transistors in the memory string connected between a second drain or source terminal of the first select transistor and a first drain or source terminal of a second select transistor, each memory cell transistor having two floating gates; and a second conductor connected to a second drain or source terminal of the second select transistor in the memory string, wherein the first and second conductors are (i) each coupled to a charging transistor, a discharging transistor and a sense amplifier, and (ii) each selectably activated by an address decoder;

wherein a first select line is connected to a gate of the first select transistor of the first memory string, a second select line is connected to a gate of the first select transistor of the second memory string, a third select line is connected to a gate of the second select transistor of the first memory string and a fourth select line is connected to a gate of the second select transistor of the second memory string; and wherein the first select line and the second select lines are electrically isolated from each other and wherein the third select line and the fourth select line are electrically isolated from each other.

16. The memory array of claim 15, wherein the memory cell transistor of first memory string is separated from a memory cell transistor of the second memory string by an isolation layer.

17. The memory array of claim 16, wherein the isolation layer is a shallow trench isolation.

18. The memory array of claim 15, each memory cell being capable of storing charge in different amounts to allow representation of multiple data bits.

19. The memory array of claim 15, wherein gates of corresponding memory cells from the memory strings are connected.

* * * * *